US008670737B2

(12) United States Patent  (10) Patent No.: US 8,670,737 B2
Jensen  (45) Date of Patent: Mar. 11, 2014

(54) DIGITAL DELTA SIGMA MODULATOR AND APPLICATIONS THEREOF

(71) Applicant: Broadcom Corporation, Irvine, CA (US)

(72) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/907,354

(22) Filed: May 31, 2013

(65) Prior Publication Data

US 2013/0259103 A1  Oct. 3, 2013

Related U.S. Application Data

(63) Continuation of application No. 10/856,133, filed on May 28, 2004, now abandoned.

(51) Int. Cl.
*H04B 1/06* (2006.01)
*H04B 7/00* (2006.01)

(52) U.S. Cl.
USPC ........... 455/260; 455/255; 455/257; 455/258; 455/259; 455/265; 332/126; 332/127

(58) Field of Classification Search
USPC ................ 455/101, 108, 112, 126, 119, 76, 455/255–265; 332/100, 126, 127; 341/143–144; 375/296, 376, 90; 331/16, 25
See application file for complete search history.

(56) References Cited

U.S. PATENT DOCUMENTS

| 5,719,573 | A | * | 2/1998 | Leung et al. | 341/143 |
| 5,986,512 | A | * | 11/1999 | Eriksson | 331/16 |
| 6,011,815 | A | * | 1/2000 | Eriksson et al. | 375/296 |
| 6,400,297 | B1 | * | 6/2002 | Tucker | 341/143 |
| 6,834,183 | B2 | * | 12/2004 | Black et al. | 455/182.1 |
| 6,961,400 | B1 | * | 11/2005 | Huff et al. | 375/376 |
| 7,116,721 | B1 | * | 10/2006 | Melanson et al. | 375/247 |
| 7,120,396 | B2 | * | 10/2006 | Wilson | 455/108 |
| 2005/0163232 | A1 | * | 7/2005 | Norsworthy et al. | 375/247 |

OTHER PUBLICATIONS

Norsworthy; Effective Dithering of Sigma-Delta Modulators; IEEE International Symposium on Circuits and Systems; 1992; pp. 1304-1307, vol. 3.

* cited by examiner

*Primary Examiner* — Tuan A Tran
(74) *Attorney, Agent, or Firm* — Garlick & Markison; Randy W. Lacasse

(57) ABSTRACT

A digital delta sigma modulator includes an input integration stage, a resonating stage, a quantizer, and a plurality of feedback paths operably coupled to the quantizer, the input integration stage, and the resonating stage. The input integration stage is operably coupled to integrate a digital input signal to produce an integrated digital signal, wherein the input integration stage has a pole at substantially zero Hertz. The resonating stage is operably coupled to resonate the integrated digital signal to produce a resonating digital signal, wherein the resonating stage has poles at a frequency above zero Hertz. The quantizer stage is operably coupled to produce a quantized signal from the resonating digital signal.

20 Claims, 6 Drawing Sheets integrated radio circuit 50

RF transmitter 120 fractional N frequency synthesizer 150

ΔΣ modulator 190 quantization noise transfer function

DIGITAL DELTA SIGMA MODULATOR AND APPLICATIONS THEREOF

CROSS-REFERENCE TO RELATED APPLICATIONS

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility application Ser. No. 10/856,133, entitled "Digital Delta Sigma Modulator and Applications Thereof," filed May 28, 2004, pending.

BACKGROUND OF THE INVENTION

1. Technical Field of the Invention

This invention relates generally to wireless communications and in particular to oscillation circuits that may be used to facilitate such wireless communications.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

The transceiver further includes a local oscillator generator (LO GEN) that produces the local oscillations used by the receiver section and by the transmitter section. Typically, the LO GEN will include a fractional-N synthesizer, which is capable of synthesizing frequencies over wide bandwidths with narrow channel spacing. As with most electronic devices, the demand for high performance universal frequency synthesizers is growing with the increasing performance and integration requirements of wireless communications systems such as cellular telephones and PDAs. The driving forces are lower cost, smaller form factors, and lower power consumption for consumer end products.

As is known, fractional-N phase locked loop (PLL) frequency synthesis is a popular indirect frequency synthesis method for high performance applications such as cellular telephony due to its agility and the ability of synthesizing frequencies over wide bandwidths with narrow channel spacing. For example, in GSM cellular telephony, one pair of RF bands, i.e., transmit and receive bands, consists of the frequencies 880.2 MHz to 914.8 MHz and 925.3 Mhz to 959.9 MHz, respectively. In these bands, the channel spacing is 200 kHz. In addition, the GSM standard requires synthesizer settling to an absolute accuracy of 90 Hz within approximately 280 us.

Such a fractional-N PLL frequency synthesizer may include a precise crystal oscillator providing a reference frequency, a phase and frequency detector (PFD), a charge pump (CP), a low pass loop filter (LPF), a voltage controlled oscillator (VCO), and a multiple divider blocks in the feedback path that each divide the incoming signal by some integer of either fixed or programmable value. Typically, the fixed dividers are in the front-end of the divider chain, while the programmable divider—also referred to as the multi-modulus divider (MMD)—is the last divider stage before the feedback signal is inputted to the PFD feedback terminal. Typically, the MMD is only capable of dividing by a small number of different integer divide values.

Two fixed divide-by-2 blocks allows for the synthesizer to easily generate in-phase (I) and quadrature (Q) carrier signals in four different GSM bands, namely the bands around 850 MHz, 900 Mhz, 1800 Mhz, and 1900 MHz, by tuning the VCO appropriately around 3.6 GHz. In fact, without the fixed divide-by-2 blocks, two separate VCOs would have to be employed to support this wide range of frequency tuning. The four RF bands of GSM are also referred to as the GSM850, GSM900, DCS, and PCS bands, respectively.

In a properly designed system, the feedback loop properties of the fractional-N PLL results in the VCO output "locking" to a frequency equal to the product of crystal oscillator reference frequency and the "average" divide ratio of the divider chain. A known method of generating an "average" divide ratio by selecting from a few integer divide values is to employ an over-sampling ΔΣ modulator to control the selection of divide ratios of the MMD. Internally, the MMD selects a certain integer divide ratio for the next cycle based on the integer output of the ΔΣ modulator. The selection of a new divide ratio is triggered by a rising edge of the MMD output, and hence occurs with a rate approximately equal to the reference frequency.

Briefly, an all-digital ΔΣ modulator is capable of reproducing a high resolution constant input value, for example a 20-bit value, as the average of a long sequence of coarse integer valued outputs, for example binary outputs. Specifically, on a sample-by-sample basis, the coarse ΔΣ modulator output selects the divide ratio for the next cycle. By alternating pseudo randomly between integer divide ratios, the ΔΣ modulator can effectively interpolate a fractional division ratio with fine resolution such that the frequency resolution requirements of high performance applications, such as cellular telephony, can be accommodated for.

For example, suppose it is desired that the GSM output of the fractional-N PLL frequency synthesizer lock to a frequency of 890.0 MHz, and suppose that it employs a 26 MHz crystal reference oscillator. It follows that the average divide ratio of the MMD must be equal to 890/26=34.2308 . . . . Thus, the "Channel Select" input to the ΔΣ modulator is the number 890/26 represented with high accuracy, for example 20 bits. It is the task of the ΔΣ modulator to output only integer valued samples, corresponding to the available divide values of the MMD, in such a fashion that the average value of the outputs equals 890/26. This average divide ratio can be achieved in various ways. For example, if a ΔΣ modulator with binary output is employed, the MMD divides by 33 whenever the ΔΣ modulator output equals −1, and the MMD divides by 35 whenever the ΔΣ modulator output equals 1. The ΔΣ modulator chooses between the divide ratios 33 and 35 in such a pattern that the average ratio is 890/26 and such that the sample-by-sample error—equal to the difference between the chosen integer divide value and the ratio 890/26—is modulated to predominantly occupy high frequencies. By providing this spectral shaping of the divide error, most of the error can be removed by the low pass loop filter (LPF), resulting in a high quality output oscillation, or, equivalently, an output oscillation with very little "phase noise", approximately as if the feedback path implemented a true fractional divider.

For fractional-N PLL frequency synthesis, two types of ΔΣ modulators have been used. One is the so-called "single-quantizer" ΔΣ modulator and the other is the so-called "MASH" ΔΣ modulator. For a single-quantizer ΔΣ modulators, the output is typically a few bits, but can be as coarse as a single bit. Further, the prior art ΔΣ modulator consists of three integrators and gains $g_1$, $g_2$ and $g_3$ coupled in a feedforward constellation. For the purposes of performance analysis, the ΔΣ modulator is often represented in the linearized model. In this model, the quantization noise, q[n], is modeled as a white, additive noise source, uncorrelated with the input. The quantization noise transfer function, NTF, describes the transfer function between the output y[n] and q[n], i.e., NTF (z)=Y(z)/Q(z) and is used to—both qualitatively and quantitatively—estimate the quantization noise floor at the ΔΣ modulator output. For the prior art ΔΣ modulator, it can be shown that the ΔΣ modulator yields an NTF that, for low frequencies, satisfies $$NTF(z) \propto (1-z^{-1})^3.$$

Thus, three coincident zeros at DC are present in the NTF, and hence quantization noise is rejected strongly close to DC and increases monotonically for higher frequencies.

For MASH ΔΣ modulators, the output is always multi-bit since multiple quantizer outputs are combined to form the overall MASH ΔΣ modulator output y[n]. Again, it can be shown that the NTF possesses three coincident zeros at DC.

For wide-band fractional-N PLL frequency synthesizers, the ΔΣ modulator architecture should be chosen carefully. In addition to the in-band noise shaping, the out-of-band shaped noise substantially affects the synthesizer phase noise performance. Comparing the noise shaping performance of the multi-bit single-quantizer ΔΣ modulator and the MASH ΔΣ modulator, the former can achieve more desirable noise shaping because of lower out-of-band noise power, but the latter represents a simpler, high-order ΔΣ modulator architecture with no stability problem. In addition, MASH ΔΣ modulators generate more wide-spread output patterns, and thus impose more stringent requirements on the phase detector design. Widely spread ΔΣ modulator output value patterns make the synthesizer more sensitive to substrate noise coupling since the ΔΣ modulator turn-on time of the charge pump in the locked condition is larger than a ΔΣ modulator with fewer bit of output resolution. With its susceptibility to substrate noise coupling, this phenomenon is particularly troublesome in CMOS implementations. Thus, to minimize substrate noise coupling, the output resolution of the ΔΣ modulator should ideally be single bit, since this yields the shortest turn-on time of the charge pump in locked condition.

Therefore, a need exists for a delta sigma modulator that produces a single bit output to reduce susceptibility to substrate noise coupling and improved quantized noise shaping properties.

BRIEF SUMMARY OF THE INVENTION

The digital delta sigma modulator and applications thereof of the present invention substantially meets these needs and others. In one embodiment, a digital delta sigma modulator includes an input integration stage, a resonating stage, a quantizer and feedback paths from the quantizer to the integration stage and the resonating stage. The input integration stage is operably coupled to integrate a digital input signal to produce an integrated digital signal, wherein the input integration stage has a pole at substantially zero Hertz. The resonating stage is operably coupled to resonate the integrated digital signal to produce a resonating digital signal, wherein the resonating stage has poles at a frequency above zero Hertz. The quantizer stage is operably coupled to produce a quantized signal from the resonating digital signal.

In another embodiment, a fractional-N frequency synthesizer includes a phase and frequency detection module, a charge pump, a loop filter, a voltage controlled oscillation module, and a feedback module. The feedback module includes a multi-modulus divider module and a delta sigma control module, wherein the delta sigma control module includes an input integration stage, a resonating stage, and a quantizer stage. The phase and frequency detection module is operably coupled to produce a difference signal from at least one of phase differences and frequency differences between a reference oscillation and a feedback oscillation. The charge pump is operably coupled to convert the difference signal into a current signal. The loop filter is operably coupled to convert the current signal into a control voltage. The voltage controlled oscillation module is operably coupled to convert the control voltage into an output oscillation. The feedback module is operably coupled to produce the feedback oscillation from the output oscillation. The input integration stage is operably coupled to integrate a digital input signal to produce an integrated digital signal, wherein the input integration stage has a pole at substantially zero Hertz. The resonating stage is operably coupled to resonate the integrated digital signal to produce a resonating digital signal, wherein the resonating stage has poles at a frequency above zero Hertz. The quantizer stage is operably coupled to produce a quantized signal from the resonating digital signal.

DETAILED DESCRIPTION OF THE INVENTION

Figure 1:
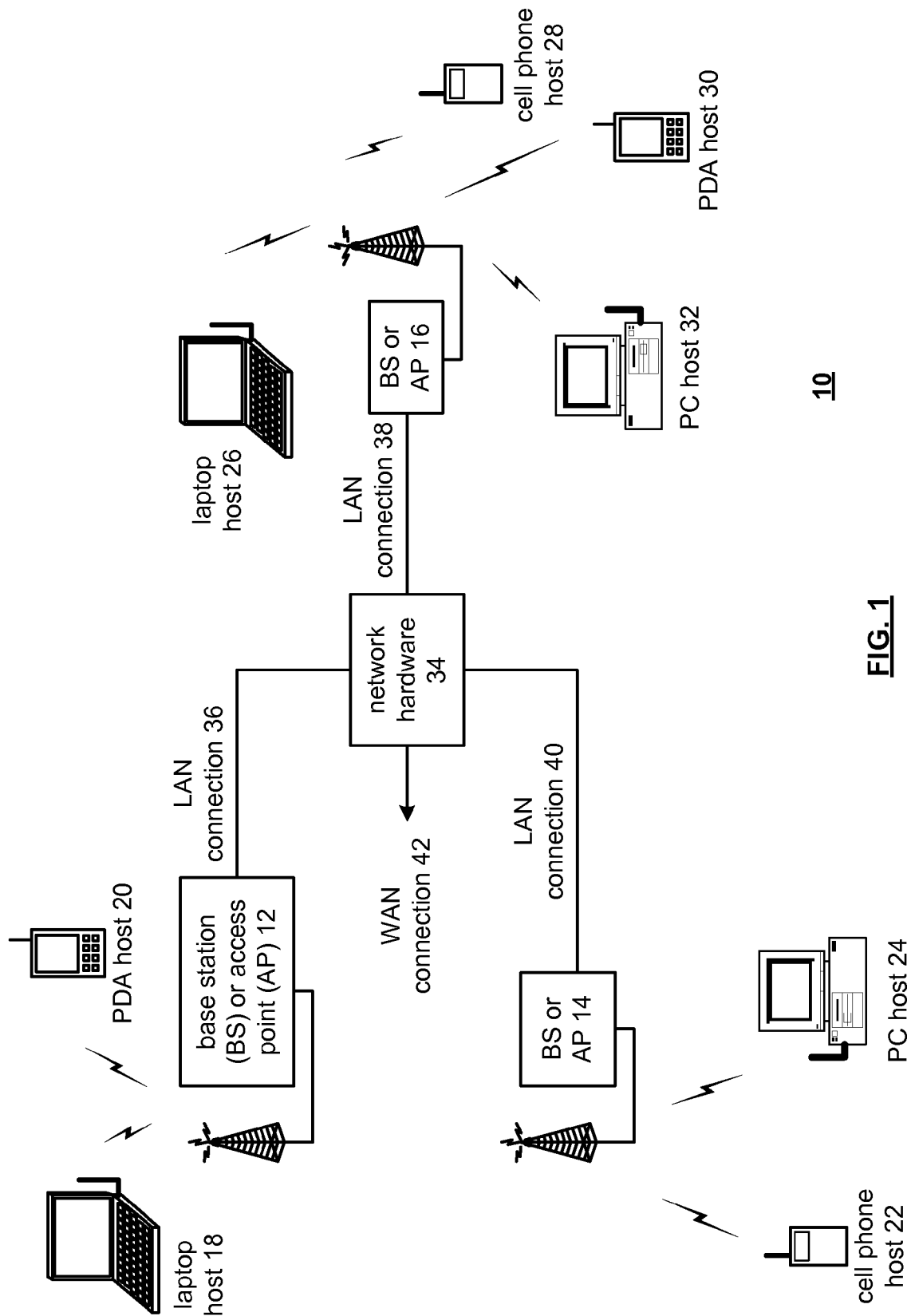
FIG. 1 is a schematic block diagram of an embodiment of a communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
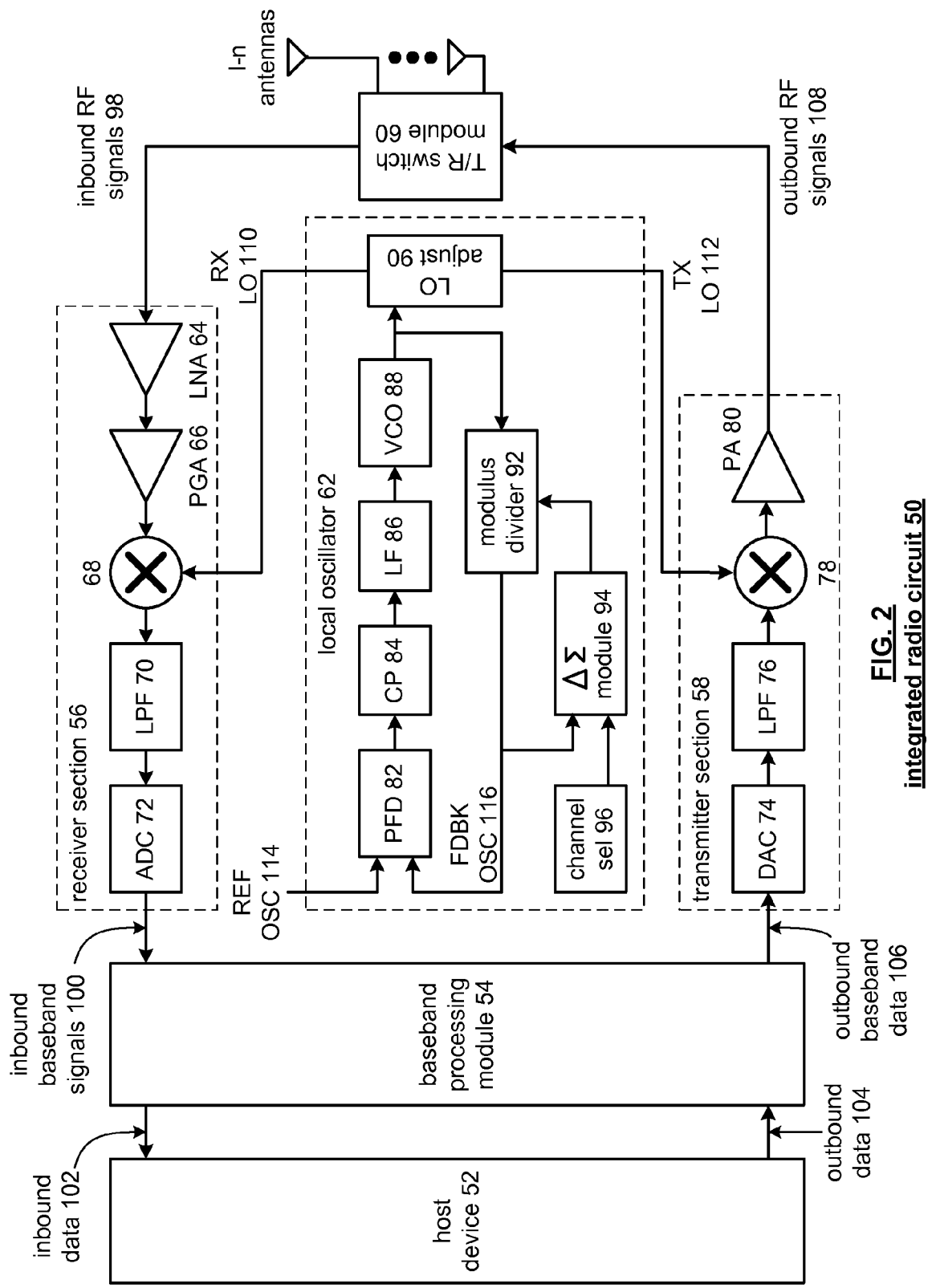
FIG. 2 is a schematic block diagram of an embodiment of an integrated radio circuit in accordance with the present invention.

FIG. 2 is a schematic block diagram illustrating an integrated radio circuit 50 of a wireless communication device 18-32. The integrated radio circuit 50 includes the host device 52 and an associated radio. For cellular telephone hosts, the associated radio is a built-in component of the wireless communication device. For personal digital assistants hosts, laptop hosts, and/or personal computer hosts, the associated radio may be built-in or an externally coupled component.

The host device 52 may include a processing module, memory, a radio interface, an input interface, and an output interface. The processing module and memory execute the corresponding instructions that are typically done by the host device. For example, for a cellular telephone host device, the processing module performs the corresponding communication functions in accordance with a particular cellular telephone standard.

The radio interface allows data to be received from and sent to the associated radio. For data received from the associated radio (e.g., inbound data), the radio interface provides the data to the processing module for further processing and/or routing to the output interface. The output interface provides connectivity to an output display device such as a display, monitor, speakers, et cetera such that the received data may be displayed. The radio interface also provides data from the processing module to the associated radio. The processing module may receive the outbound data from an input device such as a keyboard, keypad, microphone, et cetera via the input interface or generate the data itself. For data received via the input interface, the processing module may perform a corresponding host function on the data and/or route it to the radio via the radio interface.

The associated radio includes a baseband processing module 54, a receiver section 56, a transmitter section 58, a transmit/receive (T/R) switch module 60, a local oscillator 62, and one or more antennas. The receiver section 56 includes a low noise amplifier 64, programmable gain amplifier 66, down conversion mixer 68, low pass filter 70 and analog-to-digital converter 72. The transmitter section 58 includes a digital-to-analog converter 74, low pass filter 76, up-conversion mixing module 78, and a power amplifier 80. The local oscillator 62 includes a phase and frequency detection module 82, a charge pump 84, loop filter 86, voltage controlled oscillator 88, local oscillator adjust module 92, modulus divider module 92, Delta Sigma module 94 and a channel select module 96.

The baseband processing module 54 may be a single processing device or a plurality of processing devices and have associated memory. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module 54 implements one or more of its functions via a state machine, analog circuitry, digital circuitry, and/or logic circuitry, the associated memory storing the corresponding operational instructions may be embedded within, or external to, the circuitry comprising the state machine, analog circuitry, digital circuitry, and/or logic circuitry.

In operation, the baseband processing module 54 receives outbound data 104 from the host device 52 and converts it into outbound baseband data 106 in accordance with one or more wireless communication standards (e.g., Bluetooth, GSM, IEEE 802.11x). The digital-to-analog converter 74 converts the outbound baseband data or signals 106 into analog signals. The low pass filter 76 filters the analog signals and provides them to the up-converting mixing module 78. The mixing module 78 mixes the analog signals with a transmit local oscillation 112 to produce RF signals. The power amplifier 80 amplifies the RF signals to produce outbound RF signals 108. The T/R switch module 60 provides the outbound RF signals 108 to the one or more antennas for transmission to other wireless communication devices.

In a receive mode, the T/R switch module 60 receives inbound RF signals 98 via the one or more antennas and provides them to the low noise amplifier 64 of receiver section 56. The low noise amplifier 64 amplifies the inbound RF signals 98 and provides the amplified signals to the programmable gain amplifier 66. The programmable gain amplifier 66 further amplifies the signals and provides the amplified signals to the down conversion mixing modules 68. The down conversion mixing module 68 mixes the amplified RF signals 98 with a receive local oscillation 110 to produce baseband or low IF analog signals. The low pass filter 70 filters the baseband analog signals and/or low IF signals and provides the filtered signals to the analog-to-digital converter 72. The analog-to-digital converter 72 converts the signals into the digital domain to produce the inbound baseband signals 100. The baseband processing module 54 converts the inbound baseband signals 100 into inbound data 102 in accordance with one or more wireless communication standards.

The local oscillator 62 functions to produce the receive local oscillation 110 and transmit local oscillation 112. The particular frequencies of the receive and transmit local oscillations 110 and 112 may be adjusted via the channel select module 96.

In operation, the phase and frequency detector (PFD) module 82 generates an up-signal or down-signal based on phase and/or frequency differences between a reference oscillation 114 and a feedback oscillation 116. The charge pump (CP) 84 converts the up-signal and/or down-signal into a current. The loop filter (LF) 86 converts the current into a control voltage. The voltage controlled oscillator (VCO) 88 converts the control voltage into an oscillation. The LO adjust module 90 may include one or more dividers and/or multipliers to change the rate of the output oscillation of the VCO 88 to produce the corresponding local oscillations 110 and 112.

To produce the feedback oscillation 116, the modulus divider 92 divides the output oscillation of the VCO 88 by a particular integer divider value. The divider value may be produced by the Delta Sigma modulator 94 based on a signal produced by the channel select module 96. The Delta Sigma modulator 94 will be described in greater detail with reference to FIGS. 3, 4 and 6.

In one embodiment, the local oscillator 62 may include a fractional-N PLL frequency synthesizer for application in a quad-band GSM/GPRS/EDGE cellular transceiver chip. The example fractional-N PLL frequency synthesizer includes a precise 26 MHz crystal oscillator providing a reference frequency, a phase and frequency detector (PFD), a charge pump (CP), a low pass loop filter (LF), a voltage controlled oscillator (VCO), and the LO adjust module 90 including two fixed divide-by-2 blocks that divide the VCO oscillation from the range around 3.6 GHz to the range around 1.8 GHz and the range around 900 MHz, respectively. This is followed by a multi-modulus divider (MMD) 92 which, during operation in a given channel, selectively divides the feedback signal by two different integer values.

In this example, the phase and frequency detector (PFD) 82 may include two reset-able flip-flops coupled to an AND gate in a feedback loop. Assuming that the input signals (i.e., the reference oscillation to one flip-flop and the feedback oscillation to the other) to the respective flip-flops are appropriate for driving digital circuitry, the operation of the PFD is as follows. After reset, the outputs of each flip flop (UP and DN) are LOW, or 0. When the reference oscillation goes HIGH, or 1, the UP output goes HIGH. When the feedback oscillation goes HIGH, the DN output goes HIGH momentarily, resulting in a positive edge at the AND gate output. This edge resets the two flip-flops to the initial state (UP,DN)=(0,0). Thus, any phase difference between the two input signals results in the PFD residing in the state (UP,DN)=(1,0) for a duration of time proportional to the phase difference between IN1 and IN2. Similarly, any difference in frequency between the two input signals results in the PFD residing in either the state (UP, DN)= (1,0) or the state (UP,DN)=(0,1), depending upon the sign of the frequency difference.

In this example, the charge pump responds to the (UP,DN) control signals of the PFD by either "pumping" current into the loop filter or moving current out of the filter and "pumping" it into ground. The charge pump consists of two equally weighted current sources, each with a nominal output current $I_{CP}$, in an arrangement with two switches controlled by UP and DN. Thus, it follows that the CP essentially functions as an asynchronously clocked digital-to-analog converter (DAC) whose nominal output $y_{CP}(t)$ depends upon the digital inputs UP and DN such that $$y_{CP}(t) = \begin{cases} I_{CP}, & \text{if } \{UP, DN\} = \{1, 0\} \\ 0, & \text{if } \{UP, DN\} = \{1, 1\} \\ 0, & \text{if } \{UP, DN\} = \{0, 0\} \\ -I_{CP}, & \text{if } \{UP, DN\} = \{0, 1\} \end{cases}$$

It follows from the above discussion of the PFD and the CP that under nominal conditions, current pulses proportional to either a phase or a frequency difference between the reference and the feedback signals are generated by the PFD/CP combination. The action of the closed feedback loop is to cause the feedback signal to eventually settle such that both signals are "locked" in both phase and frequency. The degree to which deviations away from the locked state are allowed depends upon the sharpness of the loop filter and contributes to the amount of phase noise in the output; a sharper loop filter results in less phase noise at the expense of an increased loop settling time. Essentially, the loop settling time is the amount of time it takes for the loop to settle accurately when changing from channel to channel, a topic covered in more detail in a later section.

Note that this example may be represented as a linearized model to demonstrate the effective signal processing performed by the phase locked loop on the input referred signal as it is translated to the RF. Note that both the crystal reference signal and the feedback signal with the $\Delta\Sigma$ modulated divider constitute input-referred signals. In this model, $\Theta_{IN}$ denotes the input phase (i.e., the crystal reference) and $\Theta_{DCS/PCS}$ and $\Theta_{GSM850/900}$ denote the outputs in the four bands. In this model, the PFD/charge pump configuration is represented as a gain, $i_{CP}$, the VCO is represented as a gain and an integrator, $K_{VCO}$, and 1/s, respectively, and the multi-modulus divider is represented as a fixed divide-by-N with and additive noise source, $\Theta_{\Delta\Sigma}$, representing the divide error. Applying standard linear system analysis, the transfer functions, denoted $H_{DCS/PCS}(s)$ and $H_{GSM850/900}(s)$, between the RF outputs in the DCS/PCS and GSM850/900 bands, respectively, and input can be expressed in terms of charge pump current, $i_{CP}$, loop components, VCO sensitivity, $K_{VCO}$, and divide ratios. Specifically, defining $$P(s) = \frac{C_2R_2s + 1}{C_1C_2C_3R_2R_3s^2 + (C_1C_3R_3 + C_1C_2R_2 + C_2C_3R_2 + C_2C_3R_3)s + (C_1 + C_2 + C_3)} = \frac{n_1s + 1}{d_2s^2 + d_1s + d_0}$$

and $$K_{CV} = i_{CP} \times K_{VCO},$$

$$M = 4 \times N$$

it can be shown that $$H_{DCS/PCS}(s) = \frac{\frac{M}{2}K_{CV}(n_1s + 1)}{Md_2s^4 + Md_1s^3 + Md_0s^2 + K_{CV}(n_1s + 1)}$$

and thus $$H_{GSM850/900}(s) = \frac{1}{2}H_{DCS/PCS}(s).$$

Subsequently, the transfer functions $H_{DCS/PCS}(s)$ and $H_{GSM850/900}(s)$ will be referred to as the PLL signal filter, independent of exactly which RF band is being considered.

Figure 3:
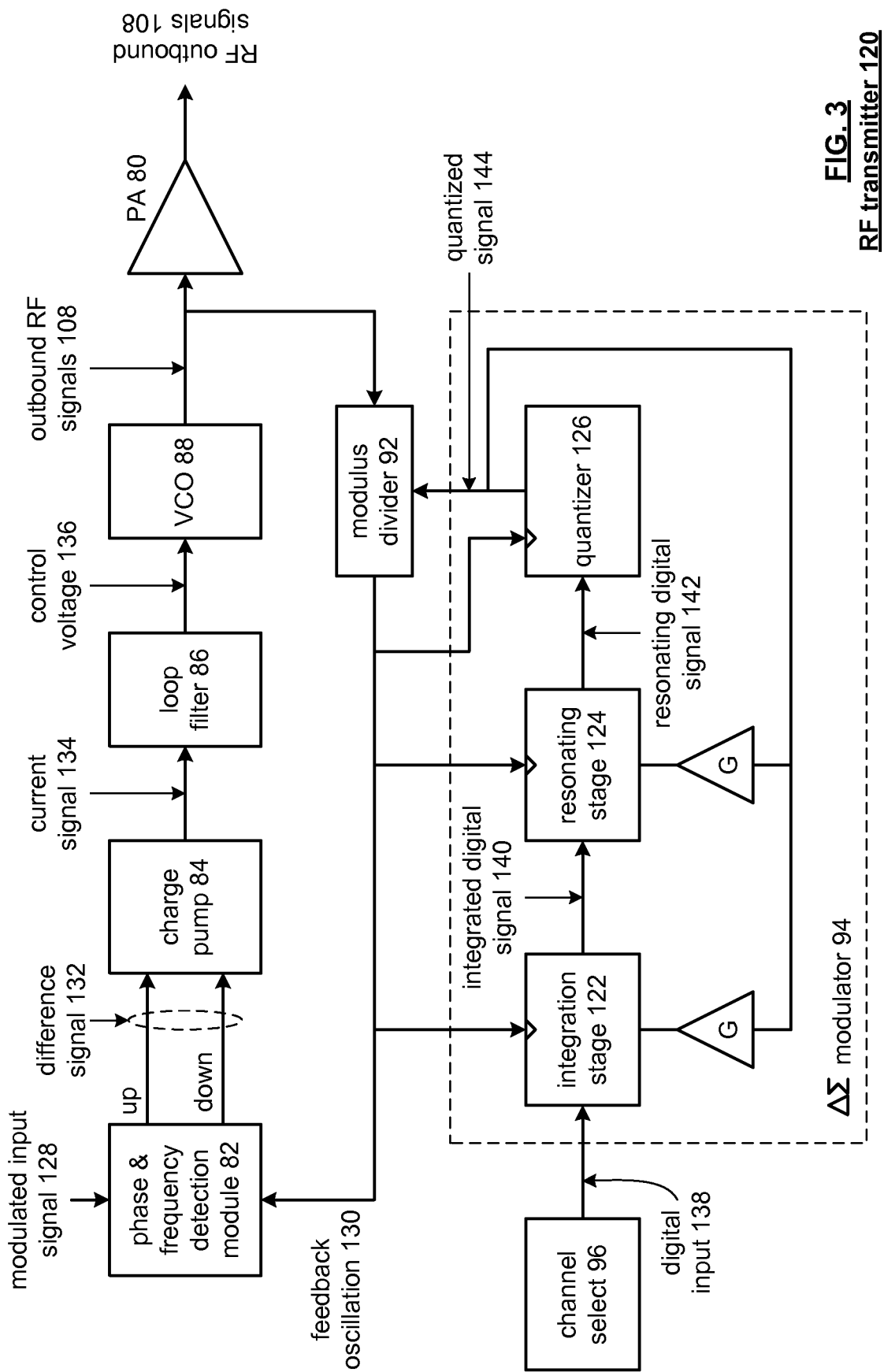
FIG. 3 is a schematic block diagram of an embodiment of an RF transmitter in accordance with the present invention.

FIG. 3 is a schematic block diagram of a radio frequency transmitter 120 that includes the phase and frequency detection module 82, charge pump 84, loop filter 86, VCO 88, power amplifier 80, modulus divider 92, the Delta Sigma modulator 94 and the channel select module 96. The Delta Sigma modulator 94 includes an integration stage 122, resonating stage 124, and a quantizer 126.

In operation, the phase and/or frequency detection module 82 compares the phase and frequency of a modulated input signal 128 with a feedback oscillation 130. The modulated input signal 128 may be received from the digital-to-analog converter 72 wherein the modulated input 126 is modulated in accordance with one or more wireless communication standards including GSM, Bluetooth, et cetera. Based on a phase and/or frequency difference, the phase and frequency detection module 82 produces a different signal 132 that includes an up-component and a down-component.

The charge pump 84 converts the difference signal 132 into a current signal 134. The loop filter 86 converts the current signal 134 into a control voltage 136. The VCO 88 converts the control voltage 136 into outbound RF signals 108. The power amplifier 80 amplifies the outbound RF signals 108 to produce RF outbound signals 108.

The modulus divider 92 produces the feedback oscillation 130 by dividing the frequency of the outbound RF signals 108 by a divider value, which includes a fractional component produced by the Delta Sigma modulator 94.

To produce the fractional component, the Delta Sigma modulator 94 receives a digital input 138 from the channel select module 96 and utilizes the feedback oscillation 130 as a clock signal. The integration stage 122 integrates the digital input 138 to produce an integrated digital signal 140. The resonating stage 124, which will be described in greater detail with reference to FIG. 4, resonates the integrated digital signal 140 to produce a resonating digital signal 142. The quantizer 126 quantizes the resonating digital signal 142 to produce a quantized signal 144, which provides the fractional component to the modulus divider 92.

Figure 4:
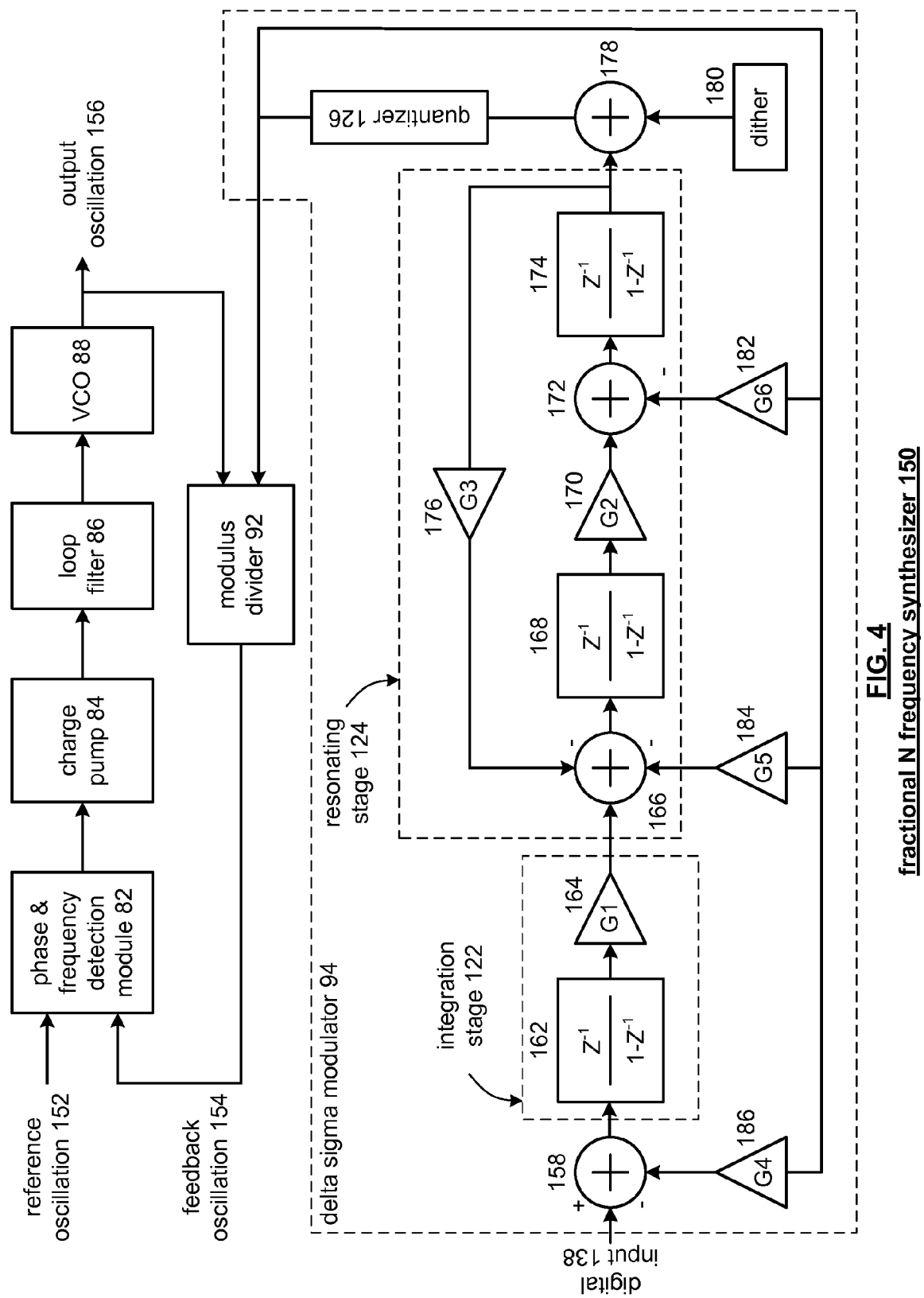
FIG. 4 is a schematic block diagram of an embodiment of a fractional N synthesizer in accordance with the present invention.

FIG. 4 is a schematic block diagram of a fractional N frequency synthesizer 150 that includes the phase and frequency detection module 82, the charge pump 84, the loop filter 86, the voltage controlled oscillator 88, the modulus divider 92, a delta sigma modulator. The delta sigma modulator includes a subtraction module 158, the integration stage 122, the resonating stage 124, a summing module 178, the quantizer 126, a dither module 180, and feedback gain modules 182, 184, 186. The integration stage 122 includes a digital integrator 162 and a gain module 164. The resonating stage 124 includes a first subtraction module 166, a first digital integrator 168, a first gain module 170, a second subtraction module 172, a second digital integrator 174, and a feedback gain module 176. The operation of the phase and frequency detection module 82, the charge pump 84, the loop filter 86, the voltage controlled oscillator 88, the modulus divider 92 is as previously discussed.

The digital input 138, which may also be referred to as a fractional input, which may be a high-resolution digital word, for example 20 bits of resolution, and through appropriate modulation of the ΔΣ modulator is converted to a sequence of +1s and −1s whose time-average equals the value of the fractional input. To achieve this, the subtraction module 158 subtracts a feedback signal from the digital input 138. The feedback signal is produced by gain module 186 as a gained representation of the ΔΣ modulator output. The integration stage 122 receives the output of the subtraction module 158 and integrates it via the digital integrator 162 and then adjusts the gain of the integrated signal via the gain module 164.

The resonating stage 124 receives the output of the integration stage 122 and produces therefrom a resonated signal. As shown, the resonating stage 124 includes the two digital integrators 168 and 174 (which may be represented as $I_2$ and $I_3$) and gain modules 170 and 176 (which may be represented as $g_2$ and $g_3$) coupled in a feedback constellation. It can be shown that incorporating such a resonating stage 124 in the ΔΣ modulator yields an NTF that, for low frequencies, satisfies $$\text{NTF}(z) \propto (1-z^{-1})((1-z^{-1})^2 + g_2g_3z^{-2}).$$

Factorizing the second term in the above expression, $$\text{NTF}(z) \propto (1-z^{-1})(1-(1-j\sqrt{g_2g_3})z^{-1})(1-(1+j\sqrt{g_2g_3})z^{-1}).$$

Thus, the NTF has zeros at $$\text{NTF}(z)=0 \text{ for } z=1, (1-j\sqrt{g_2g_3}), (1+j\sqrt{g_2g_3}).$$

It follows that choosing $g_2$ and $g_3$ appropriately allows for zeros that do not coincide with DC. This can be used to improve the signal-to-noise ratio of the invention ΔΣ modulator. In addition, the resonating stage of the ΔΣ modulator tends to keep the quantizer input more "busy" which, in turn, improves the randomness of the quantization noise, resulting in reduced tendency to generate spurs in the output signal. Further, the dither module 180 generates an appropriate amount of dither to prevent the ΔΣ modulator from generating undesired spurious contents in the output.

Figure 5:
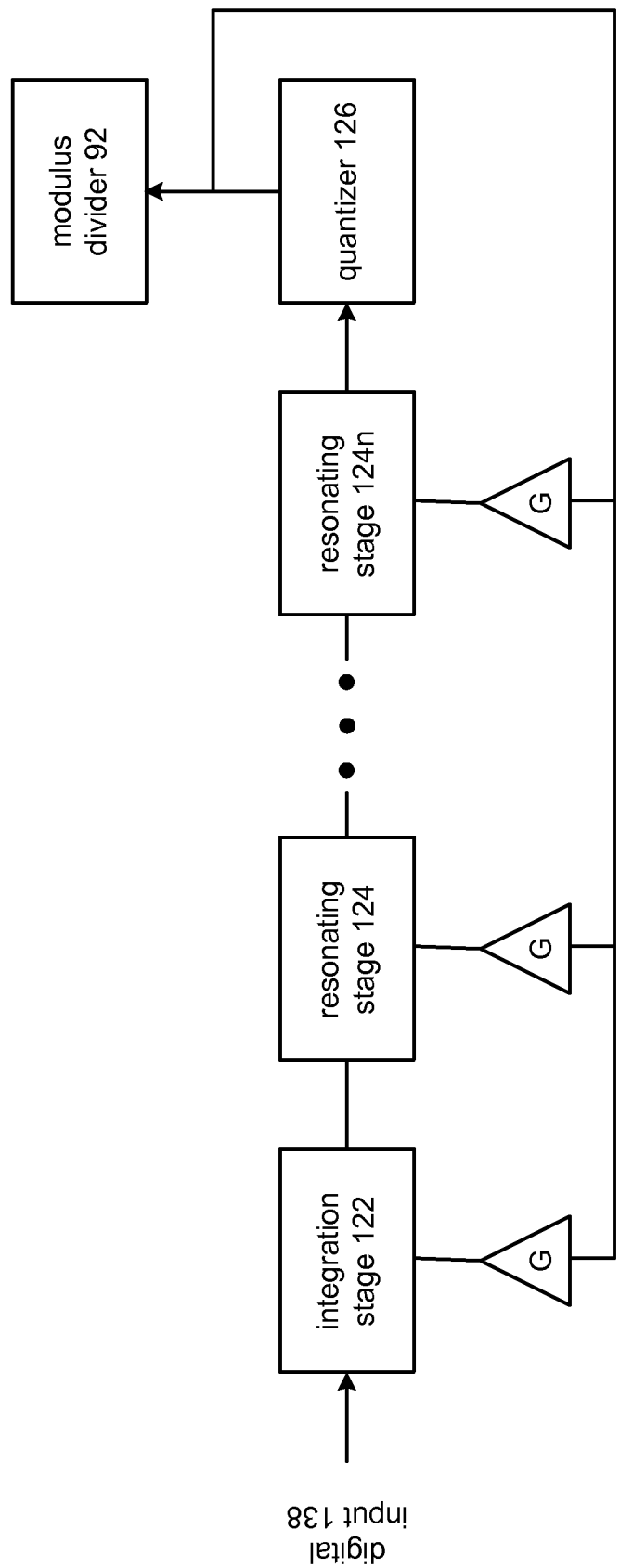
FIG. 5 is a schematic block diagram of an embodiment of a sigma delta modulator in accordance with the present invention.

FIG. 5 is a schematic block diagram of another embodiment of the Delta Sigma modulator 190 that includes the integration stage 122, a plurality of resonating stages 124-124N, the quantizer 126 with its output coupled to the modulus divider 92, and a plurality of feedback paths to the integration stage and the resonating stage. In this embodiment, the plurality of resonating stages 124-124N provide extra non-DC poles which, for the transfer function of the fractional-N synthesizer provides non-DC zeros.

Figure 6:
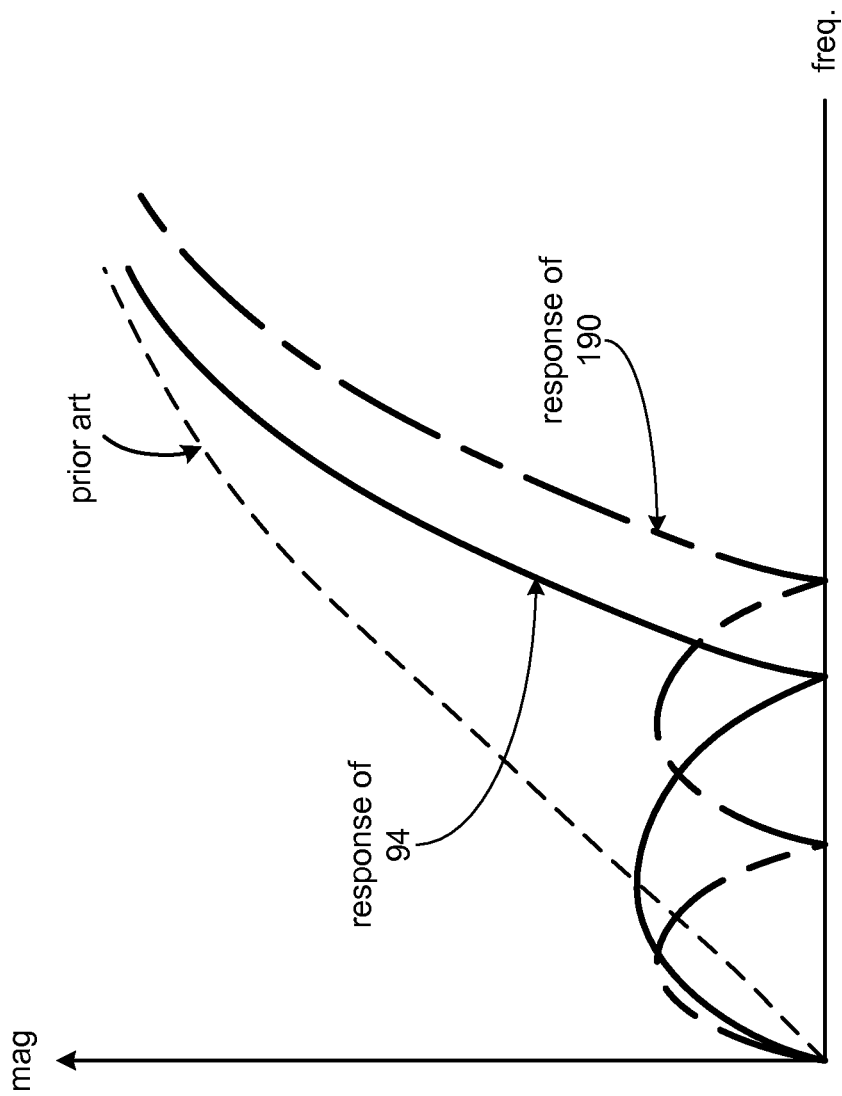
FIG. 6 is a diagram of an example of quantization noise transfer function in accordance with the present invention.

FIG. 6 is a graph of the quantization noise transfer function of the fractional-N synthesizer of the prior art, the fractional-N synthesizer including Delta Sigma modulator 94 and the fractional-N synthesizer including the Delta Sigma modulator 190. As shown, the prior art curve has its zero's all at DC thus producing the noise transfer function as shown.

By including the resonating circuit in the Delta Sigma modulator 94, one or more zeros may be moved from DC (e.g., to 40 KHz), to produce the noise transfer curve as shown in response to the Delta Sigma modulator 94.

By adding a plurality of resonating stages in the Delta Sigma modulator as shown in FIG. 5, multiple zeros at non-DC may be added to the quantization noise transfer function as shown with respect to the response of Delta Sigma modulator 190.

As one of average skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a digital delta sigma modulator having improved signal-to-noise ratios, which, when incorporated in a fractional N frequency synthesizer improves the synthesizer's performance as well. As one of average skill in the art will appreciate, other embodiments may be derived from the teachings of the present invention without deviating from the scope of the claims.

What is claimed is:

1. A digital delta sigma modulator comprising:
    an input integration stage comprising a digital integrator operably coupled to integrate a digital input signal to produce an integration output and
    a first gain module (g1) operably coupled to adjust magnitude of the integration output to produce an integrated digital signal;
    a resonating stage operably coupled to resonate the integrated digital signal to produce a resonating digital signal comprising: a first integration stage operably coupled to integrate a first resonating digital signal to produce a first integrated resonating digital signal; a second gain stage ($g_2$) operably coupled to adjust magnitude of the first resonating integrated digital signal to produce a second resonating digital signal; a second integration stage operably coupled to integrate the second resonating digital signal to produce the resonating digital signal; and a resonating feedback third gain module ($g_3$) operably coupled to adjust magnitude of the resonating digital signal to produce a resonating feedback signal, and wherein a noise transfer function (NTF) of the resonating stage satisfies:

$$\text{NTF}(z) \propto (1-z^{-1})((1-z^{-1})^2 + g_2 g_3 z^{-2});$$

and
    a quantizer stage operably coupled to produce a quantized signal from the resonating digital signal.

2. The digital delta sigma modulator of claim 1 further comprising:
    a feedback fourth gain module ($g_4$) operably coupled to adjust magnitude of the quantized signal to produce a first feedback signal; and
    a first subtraction module operably coupled to subtract the first feedback signal from an input to produce the digital input signal.

3. The digital delta sigma modulator of claim 2, wherein the resonating stage further comprises:
    a second subtraction module operably coupled to subtract the resonating feedback signal from the integrated digital signal to produce the first resonating digital signal.

4. The digital delta sigma modulator of claim 3 further comprising:
    a fifth feedback gain module ($g_5$) operably coupled to the second subtraction module to adjust magnitude of the quantized signal to produce a second feedback signal;
    a sixth feedback gain ($g_6$) module operably coupled to adjust the magnitude of the quantized signal to produce a third feedback signal; and
    a third subtraction module operably coupled to subtract the third feedback signal from an output of the second gain stage ($g_2$) to produce the second resonating digital signal.

5. The digital delta sigma modulator of claim 1, wherein the quantizer comprises:
    a dither module operably coupled to generate a dither digital signal;
    an addition module operably coupled to add the dither digital signal and the resonating digital signal to produce a dithered resonating digital signal; and
    a single-bit quantizer operably coupled to produce the quantized signal from dithered resonating digital signal.

6. The digital delta sigma modulator of claim 1 further comprising:
    a second resonating stage operably coupled to resonate the resonating digital signal to produce a second resonating digital signal, wherein the second resonating stage has poles at a frequency above zero Hertz and at different frequencies than the frequencies of the poles of the first resonating stage according to:

$$\text{NTF}(z)=0 \text{ for } z=1, (1-j\sqrt{g_2 g_3}), (1+j\sqrt{g_2 g_3})$$

and wherein the quantizer stage quantizes the second resonating digital signal to produce the quantized signal.

7. A fractional-N frequency synthesizer comprising:
    a phase and frequency detection module operably coupled to produce a difference signal from at least one of phase differences and frequency differences between a reference oscillation and a feedback oscillation;
    a charge pump operably coupled to convert the difference signal into a current signal;
    a loop filter operably coupled to convert the current signal into a control voltage;
    a voltage controlled oscillation module operably coupled to convert the control voltage into an output oscillation;
    a feedback module operably coupled to produce the feedback oscillation from the output oscillation, wherein the feedback module includes a multi-modulus divider module and a delta sigma control module, wherein the delta sigma control module includes:
an input integration stage comprising a digital integrator operably coupled to integrate a digital input signal to produce an integration output and
a first gain module (g1) operably coupled to adjust magnitude of the integration output to produce an integrated digital signal;
a resonating stage operably coupled to resonate the integrated digital signal to produce a resonating digital signal comprising: a first integration stage operably coupled to integrate a first resonating digital signal to produce a first integrated resonating digital signal; a second gain stage ($g_2$) operably coupled to adjust magnitude of the first resonating integrated digital signal to produce a second resonating digital signal; a second integration stage operably coupled to integrate the second resonating digital signal to produce the resonating digital signal; and a resonating feedback third gain module ($g_3$) operably coupled to adjust magnitude of the resonating digital signal to produce a resonating feedback signal, and wherein a noise transfer function (NTF) of the resonating stage satisfies:

$$NTF(z) \propto (1-z^{-1})((1-z^{-1})^2 + g_2 g_3 z^{-2});$$

and
a quantizer stage operably coupled to produce a quantized signal from the resonating digital signal.

8. The fractional-N frequency synthesizer of claim 7 further comprises:
a feedback fourth gain module ($g_4$) operably coupled to adjust magnitude of the quantized signal to produce a first feedback signal; and
a first subtraction module operably coupled to subtract the first feedback signal from an input to produce the digital input signal.

9. The fractional-N frequency synthesizer of claim 8, wherein the resonating stage further comprises:
a second subtraction module operably coupled to subtract the resonating feedback signal from the integrated digital signal to produce the first resonating digital signal.

10. The fractional-N frequency synthesizer of claim 9 further comprising:
a fifth feedback gain module ($g_5$) operably coupled to the second subtraction module to adjust magnitude of the quantized signal to produce a second feedback signal;
a sixth feedback gain ($g_6$) module operably coupled to adjust the magnitude of the quantized signal to produce a third feedback signal; and
a third subtraction module operably coupled to subtract the third feedback signal from an output of the second gain stage ($g_2$) to produce the second resonating digital signal.

11. The fractional-N frequency synthesizer of claim 7, wherein the quantizer comprises:
a dither module operably coupled to generate a dither digital signal;
an addition module operably coupled to add the dither digital signal and the resonating digital signal to produce a dithered resonating digital signal; and
a single-bit quantizer operably coupled to produce the quantized signal from dithered resonating digital signal.

12. The fractional-N frequency synthesizer of claim 7 further comprising:
a second resonating stage operably coupled to resonate the resonating digital signal to produce a second resonating digital signal, wherein the second resonating stage has poles at a frequency above zero Hertz and at different frequencies than the frequencies of the poles of the first resonating stage according to:

$$NTF(z)=0 \text{ for } z=1, (1-j\sqrt{g_2 g_3}), (1+j\sqrt{g_2 g_3})$$

and wherein the quantizer stage quantizes the second resonating digital signal to produce the quantized signal.

13. An integrated radio circuit comprising:
a transmitter section operably coupled to convert outbound baseband signals into outbound radio frequency (RF) signals based on a transmit local oscillation;
a receiver section operably coupled to convert inbound RF signals into inbound baseband signals based on a receive local oscillation; and
a local oscillation generation module operably coupled to produce the transmit local oscillation and the receive local oscillation, wherein the local oscillation generation module includes:
a phase and frequency detection module operably coupled to produce a difference signal from at least one of phase differences and frequency differences between a reference oscillation and a feedback oscillation;
a charge pump operably coupled to convert the difference signal into a current signal;
a loop filter operably coupled to convert the current signal into a control voltage;
a voltage controlled oscillation module operably coupled to convert the control voltage into an output oscillation, wherein the transmit and receive local oscillations are derived from the output oscillation;
a feedback module operably coupled to produce the feedback oscillation from the output oscillation, wherein the feedback module includes a multi-modulus divider module and a delta sigma control module, wherein the delta sigma control module includes:
an input integration stage comprising a digital integrator operably coupled to integrate a digital input signal to produce an integration output and
a first gain module (g1) operably coupled to adjust magnitude of the integration output to produce an integrated digital signal;
a resonating stage operably coupled to resonate the integrated digital signal to produce a resonating digital signal comprising: a first integration stage operably coupled to integrate a first resonating digital signal to produce a first integrated resonating digital signal; a second gain stage (g2) operably coupled to adjust magnitude of the first resonating integrated digital signal to produce a second resonating digital signal; a second integration stage operably coupled to integrate the second resonating digital signal to produce the resonating digital signal; and a resonating feedback third gain module (g3) operably coupled to adjust magnitude of the resonating digital signal to produce a resonating feedback signal, and wherein a noise transfer function (NTF) of the resonating stage satisfies:

$$NTF(z) \propto (1-z^{-1})((1-z^{-1})^2 + g_2 g_3 z^{-2});$$

and
a quantizer stage operably coupled to produce a quantized signal from the resonating digital signal.

14. The integrated radio circuit of claim 13 further comprising:
a feedback fourth gain module ($g_4$) operably coupled to adjust magnitude of the quantized signal to produce a first feedback signal; and
a first subtraction module operably coupled to subtract the first feedback signal from an input to produce the digital input signal.

15. The integrated radio circuit of claim 14, wherein the resonating stage further comprises:
a second subtraction module operably coupled to subtract the resonating feedback signal from the integrated digital signal to produce the first resonating digital signal.

16. The integrated radio circuit of claim 15 further comprising:
a fifth feedback gain module ($g_5$) operably coupled to the second subtraction module to adjust magnitude of the quantized signal to produce a second feedback signal;
a sixth feedback gain ($g_6$) module operably coupled to adjust the magnitude of the quantized signal to produce a third feedback signal; and
a third subtraction module operably coupled to subtract the third feedback signal from an output of the second gain stage ($g_2$) to produce the second resonating digital signal.

17. The integrated radio circuit of claim 13, wherein the quantizer comprises:
a dither module operably coupled to generate a dither digital signal;
an addition module operably coupled to add the dither digital signal and the resonating digital signal to produce a dithered resonating digital signal; and
a single-bit quantizer operably coupled to produce the quantized signal from dithered resonating digital signal.

18. The integrated radio circuit of claim 13 further comprising:
a second resonating stage operably coupled to resonate the resonating digital signal to produce a second resonating digital signal, wherein the second resonating stage has poles at a frequency above zero Hertz and at different frequencies than the frequencies of the poles of the first resonating stage according to:

$$\text{NTF}(z)=0 \text{ for } z=1, (1-j\sqrt{g_2 g_3}), (1+j\sqrt{g_2 g_3})$$

and wherein the quantizer stage quantizes the second resonating digital signal to produce the quantized signal.

19. The integrated radio circuit of claim 13, wherein the integrated radio circuit is part of a radio frequency (RF) transmitter.

20. The integrated radio circuit of claim 13, wherein the integrated radio circuit is part of a radio frequency (RF) transceiver.

* * * * *